United States Patent
Ku et al.

(10) Patent No.: US 8,768,108 B2
(45) Date of Patent: Jul. 1, 2014

(54) SOLID STATE LIGHT SOURCE BASED ON HYBRID WAVEGUIDE-DOWN-CONVERTER-DIFFUSER

(75) Inventors: Pei-Cheng Ku, Ann Arbor, MI (US); Max Shtein, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 372 days.

(21) Appl. No.: 12/789,596

(22) Filed: May 28, 2010

(65) Prior Publication Data

US 2010/0303409 A1    Dec. 2, 2010

Related U.S. Application Data

(60) Provisional application No. 61/182,171, filed on May 29, 2009.

(51) Int. Cl.
*G02F 1/01*     (2006.01)
*G02B 6/26*     (2006.01)
*G02B 6/42*     (2006.01)

(52) U.S. Cl.
USPC ............... 385/1; 385/31; 385/32; 385/123; 385/126; 385/127; 385/140; 250/552; 372/69; 372/70; 372/71; 372/700

(58) Field of Classification Search
USPC ........... 385/1, 32, 126, 127; 250/552; 372/71, 372/700
See application file for complete search history.

(56) References Cited

U.S. PATENT DOCUMENTS

| | | | | |
|---|---|---|---|---|
| 4,697,869 A | * | 10/1987 | So et al. ................ | 385/140 |
| 6,117,529 A | * | 9/2000 | Leising et al. ........... | 428/209 |
| 6,625,182 B1 | | 9/2003 | Kuksenkov et al. | |
| 6,802,131 B1 | * | 10/2004 | Scholz et al. ............ | 33/293 |
| 2005/0135772 A1 | * | 6/2005 | Nield et al. ............. | 385/140 |
| 2005/0140270 A1 | | 6/2005 | Henson et al. | |
| 2006/0062518 A1 | * | 3/2006 | Galstian et al. .......... | 385/27 |
| 2007/0019691 A1 | | 1/2007 | Monch et al. | |
| 2007/0187580 A1 | | 8/2007 | Kykta et al. | |
| 2007/0284600 A1 | | 12/2007 | Shchekin et al. | |
| 2009/0257242 A1 | * | 10/2009 | Wendman ............... | 362/553 |

FOREIGN PATENT DOCUMENTS

| | | | | |
|---|---|---|---|---|
| CN | 2594827 Y | | 12/2003 | |
| WO | WO-2007133727 A1 | | 11/2007 | |
| WO | WO2009/040465 | * | 4/2009 | ......... H01S 3/094 |
| WO | WO-2009126836 A1 | | 10/2009 | |

OTHER PUBLICATIONS

First Office Action, Application No. CN201080023674.3, dated Feb. 22, 2013.
Supplementary European Search Report, EP10781270.3, dated Oct. 26, 2012.

* cited by examiner

*Primary Examiner* — Ryan Lepisto
(74) *Attorney, Agent, or Firm* — Harness, Dickey & Pierce, P.L.C.

(57) ABSTRACT

A solid state light source comprising a light pump outputting light energy; a waveguide optically coupled to the light pump source for receiving the light energy; and a down-converter for converting the light energy from the waveguide to a lesser light energy.

15 Claims, 5 Drawing Sheets

SOLID STATE LIGHT SOURCE BASED ON HYBRID WAVEGUIDE-DOWN-CONVERTER-DIFFUSER

CROSS-REFERENCE TO RELATED APPLICATIONS

This application claims the benefit of U.S. Provisional Application No. 61/182,171, filed on May 29, 2009. The entire disclosure of the above application is incorporated herein by reference.

FIELD

The present disclosure relates to solid state light sources and, more particularly, relates to a solid state light source based on hybrid waveguide down-converter diffusers.

BACKGROUND AND SUMMARY

This section provides background information related to the present disclosure which is not necessarily prior art. This section also provides a general summary of the disclosure, and is not a comprehensive disclosure of its full scope or all of its features.

Currently, the United States collectively spends on the order of a trillion dollars annually on electricity for lighting alone—in fact, a quarter of most buildings' electricity usage is for lighting. Thus, even a modest increase in lighting efficiency can result in tremendous money savings and benefits to the environment. Solid state light emitting devices (LEDs or organic LEDs) potentially can replace existing incandescent and fluorescent lamps as a more energy-efficient lighting solution, offering luminous efficiencies in excess of 100 lm/W.

However, the cumulative cost of lighting comprises not only the electricity cost, but also the cost of the lamp. To be commercially viable, any emerging solid-state lighting (SSL) technology must simultaneously become both cost- and energy-competitive with fluorescent, high-intensity discharge (HID), and current LED-based lamps. Thus far, LED-based lighting has not been cost-competitive in most markets (e.g. indoor general lighting).

Importantly, in addition to luminous efficiency and cost-effectiveness, to facilitate widespread adoption, the lighting quality (i.e. the color rendering index (CRI)) must also compete with that of traditional incandescent and HID lights (typical CRI >90). Backward-compatibility with existing lighting fixtures (e.g. fluorescent lighting fixtures and Edison sockets) is also highly desirable. To date, virtually none of the emerging light sources satisfy these requirements.

Inorganic white LEDs can potentially satisfy SSL requirements and exhibit device lifetimes greater than 50,000 hours. To date, InGaN and AlInGaP based LEDs have achieved power-conversion efficiencies exceeding 50% in the blue and red wavelengths, respectively; InGaN based green LEDs have efficiencies of 30%. Due to expensive manufacturing processes (e.g. epitaxy) and non-compatible blue/green and red LEDs materials, current white LEDs are predominantly based on blue LEDs coated with yellow phosphors. This approach, however, generates very poor CRI output (ca. 70). In addition, each LED die size is only on the order of 1 mm$^2$ or smaller. Hence external lens and diffusers are required, which lead to additional manufacturing and assembly costs.

Similarly, white OLEDs are potentially capable of satisfying SSL requirements, offering superior control over the emission color, with a theoretical power efficiency exceeding 150 lumens/Watt. To date, OLEDs have exceeded 60 lm/W power efficiency, and attained CRIs of 80 or better. Nevertheless, several significant technical and scientific challenges must be overcome before they become commercially viable for SSL applications. Some of these challenges include: 1. high cost of substrates (calculations suggest that the entire OLED must cost less than \$100/m$^2$); 2. low light outcoupling efficiency (calculations suggest that the light extraction efficiency should exceed 50%); 3. poor operational lifetime of blue-emitting materials, and 4. high cost of encapsulation (especially in the context of reel-to-reel manufacturing on flexible substrates).

According to the principles of the present teachings, a solid state light source is provided comprising a light pump outputting light energy; a waveguide optically coupled to the light pump for receiving the light energy; and a down-converter for converting the light energy from the waveguide to a lesser light energy.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawing. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Figure 1:
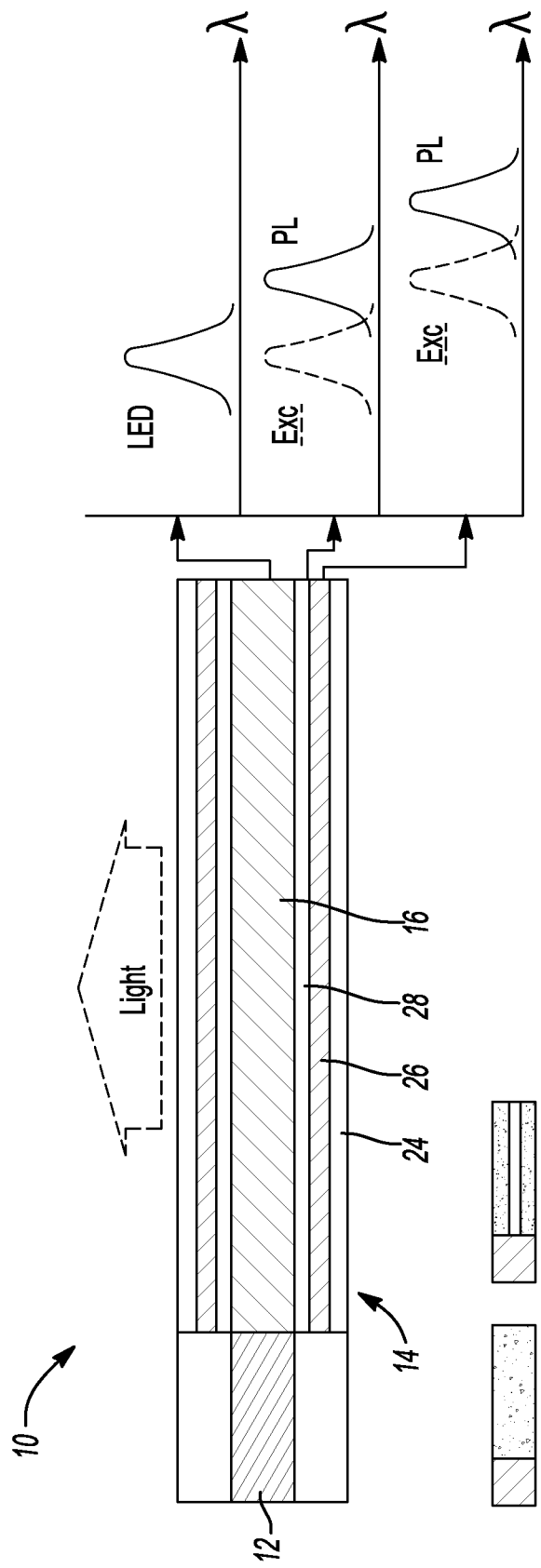
FIG. 1 is a schematic view of a solid state light source based on a hybrid waveguide-down-converter-diffuser system according to the principles of the present teachings.
Figure 2:
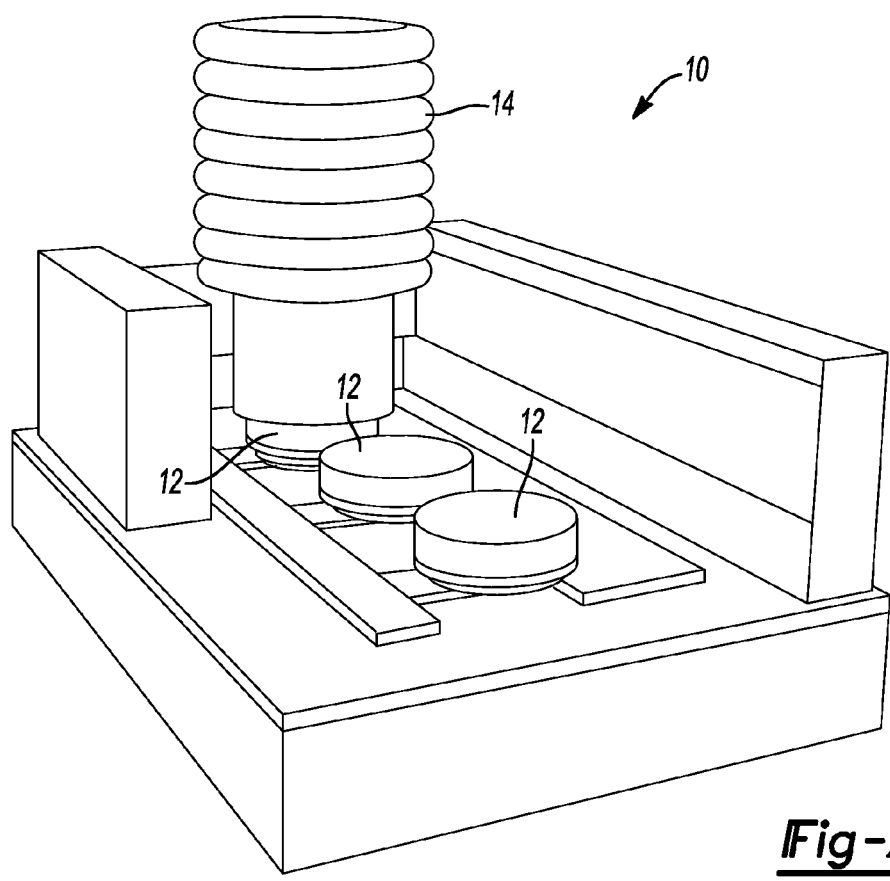
FIG. 2 is a solid state light source having an array of LEDs and associated waveguides, with portions removed for clarity.

To overcome the deficiencies of conventional solid-state lighting, the principles of the present teachings provide an approach that combines well-established technologies in a novel, effective way. As illustrated in FIGS. 1 and 2, a solid state light source 10, according to the principles of the present teachings, is provided having a light pump 12 and a waveguide assembly 14 operably coupled to light pump 12 for communication of light energy therebetween. Specifically, the present teachings provide a system wherein, in some embodiments, the output of blue LEDs is coupled to an optical waveguide or waveguide assembly comprising a waveguide core and a waveguide cladding, whereby the waveguide core has a higher refractive index compared to the waveguide cladding. The outer surface of the waveguide can be coated with wavelength conversion materials (e.g. fluorescent dyes, phosphors, and quantum dots). By properly shaping the waveguide, uniformly leaked blue light excites the wavelength conversion materials to generate a white light. A primary advantage of the present teachings compared to conventional systems includes (i) the optical intensity (optical power per unit area) of the blue excitation is considerably lower, enabling the use of wider range of wavelength conversion materials, and (ii) the form factors (size and shapes) of the lighting devices can be easily changed simply by changing the form factor of the waveguides and is not restricted by the placement of the wavelength conversion materials (e.g. elongated lighting devices for replacement use in fluorescent fixtures).

Figure 3:
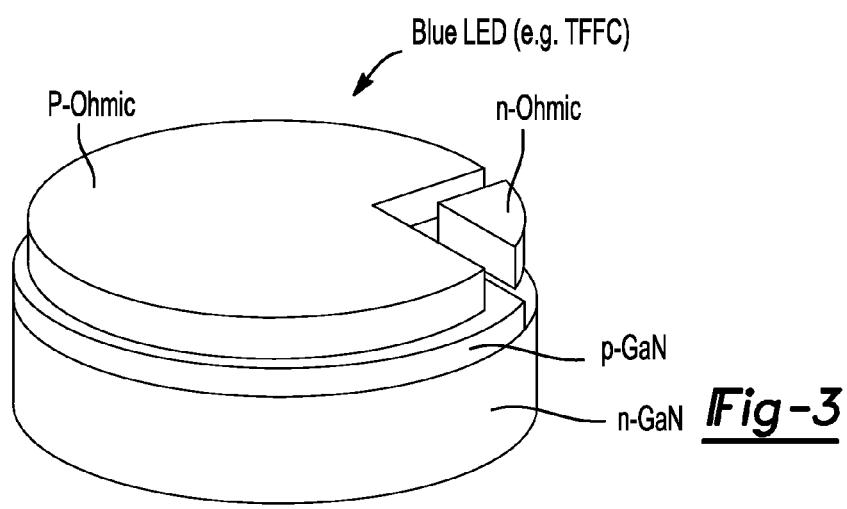
FIG. 3 is an enlarged schematic view of a blue LED.

In some embodiments, light pump 12 can comprise one or more LEDs, lasers, organic LEDs, and combinations thereof that are optically coupled to one or more waveguide assemblies 14. It should be recognized that light pump 12 can, in some embodiments, comprise LEDs of different colors, lasers of different colors, organic LEDs of different colors, and the like. With particular reference to FIGS. 1-3, light pump 12 is illustrated as a blue pump LED 12 that provides an extremely high luminous efficiency. With particular reference to FIG. 3, blue pump LED 12 can be a blue LED using a TFFC design.

With continued reference to FIGS. 1, 2, and 4-7, waveguide assembly 14 can define any one of a plurality of arrangements and designs, including circular, elliptical, planar, cylindrical, cylindrical having varying pitch and/or radius, or other shape conducive to consistent or other light output distribution. Moreover, waveguide assembly 14 can be disposed, in some embodiments, in an array configuration (as illustrated in FIG. 2). In some embodiments, waveguide assembly 14 can comprise waveguide core 16, such as a PMMA core, being substantially surrounded by a waveguide cladding 18, such as a fluorinated polycarbonate). In some embodiments, the waveguide assembly 14 can comprise a down-conversion layer 20 generally surrounding at least a portion of waveguide cladding 18. Finally, an outer surface portion 22 can be disposed about the included portions of waveguide assembly 14 to provide an out-coupling function. It should be noted that the particular arrangement of waveguide assembly 14 can vary and thus alternative shapes and layering can be employed. It should also be appreciated that each of the aforementioned layers need not be complete in that they may only cover or be disposed on a localized region to affect a predetermined light output. This light output may be tailored and/or non-uniform.

In some embodiments, as illustrated in FIG. 1, waveguide assembly 14 can further or alternately comprise dyes and/or dye layers 26, 28 (or phosphors or quantum dots) disposed at least external to waveguide core 16, such as on or in cladding 18 or external thereof that down-convert blue light from LED 12 into longer wavelengths. This can be done using a down-converter, and, in some embodiments, an exterior barrier or diffuser 24 (FIG. 1). That is, in some embodiments, the dye layers 26, 28 can absorb a blue photon and output a photon of lesser energy, such as green, red, and the like. In some embodiments, the blue light can be down-converted to yellow light. In some embodiments, the down-converting process can be multi-stepped such that blue light is first down-converted to green and then in a subsequent step the green light can be down-converted to red light. In some embodiments, the down-converting process can be completed from blue light to green light to yellow light to red light. In some embodiments, blue light can be converted into green and red in waveguide assembly 14 by doping it with the down-converter, or by doping both green and red down-converters into the cladding 18 (shown schematically in the insets of FIG. 1).

According to the present teachings, it has been found that practical losses are primarily limited to the coupling losses between LED source 12 and waveguide assembly 14, the absorption in waveguide assembly 14 and any optional cladding, and the Stokes loss in the down-converters (which will be discussed herein). These losses, except for Stokes loss, can be minimized to almost negligible levels according to the principles of the present teachings. The Stokes loss is non-negligible (ca. 25%), but is a feature that is also inherent to existing LED or fluorescent lighting.

It has been found that the total light outcoupling efficiency of the present teachings are very high. This can be attributed, in part, due to the acceptance angle (+/−30 degrees) of the waveguide core 16 to the LED source 12. Thus, the emission cone of the LED source 12 can also be narrow, which in turn facilitates increase in the monochromatic light outcoupling from the LED by means of dielectric stacks, photonic crystals, and other means. It has also been found that the surface of the cladding/barrier layer(s) can also be roughened to increase the optical coupling to air. Importantly, the color rendering index (CRI) of this assembly 10 can be tuned very precisely by the selection of down-converters from a wide variety of material systems—e.g. inorganic phosphors, fluorescent and phosphorescent organic dyes, luminescent polymers, etc.

The waveguide 14 acts to lower the excitation intensity and reduces the concentration of the down-converter (e.g. a molecular dye) by doping it into an inert matrix (e.g. PMMA, parylene, etc). This increases the operational lifetime of the down-converter, which mitigates common degradation mechanisms in conventional white LEDs.

The waveguide 14 can act as an excellent diffuser for the light escaping the assembly, potentially lowering overall fixture/luminaire costs.

To uniformly generate the white light throughout the entire device 10, the blue light transported by the waveguide 14 should be extracted uniformly along the entire length of the waveguide 14. In other words, in some embodiments, it is desirable that the light intensity and color temperature be substantially equivalent from a proximal end to a distal end of waveguide 14. However, meeting such goal is non-trivial. In some embodiments, it requires that the rate of light output managed along waveguide 14 such that is remains uniform along the length thereof. However, conventionally, the rate of light output near a source (proximal) end is greater than the rate of light output spaced from the source (distal). This difference in the rate of light output can effect the interaction of the blue light with the associated dyes at locations along the length of waveguide 14, resulting in varying light intensity and color temperature along the length of waveguide 14. Therefore, in order to uniformly generate the white light throughout the entire device 10, it is desirable to adjust the rate of light output and/or adjust the coated down-conversion layer to uniformly convert the blue light into multiple colors (e.g. green and red) and thus be mixed into the white light.

As discussed herein, conventional waveguides (e.g. plastic optical fibers) guiding blue light exhibit a finite attenuation loss. The three primary loss mechanisms include absorption loss, Rayleigh scattering, and radiation loss due to waveguide imperfection. These losses result in an exponential decay of the blue light power across the waveguide length. In the cases of Rayleigh scattering and radiation loss due to waveguide imperfection, blue light is leaked out of the waveguide, resulting in the same exponential decay in power and thus non-uniform white light.

Figure 6:
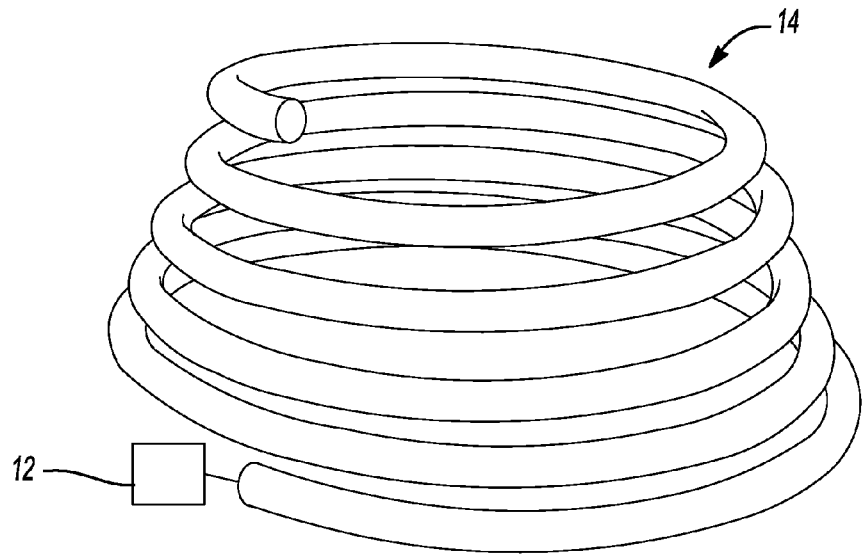
FIG. 6 is a perspective view of a waveguide according to the principles of the present teachings having a varying bending radius.
Figure 7:
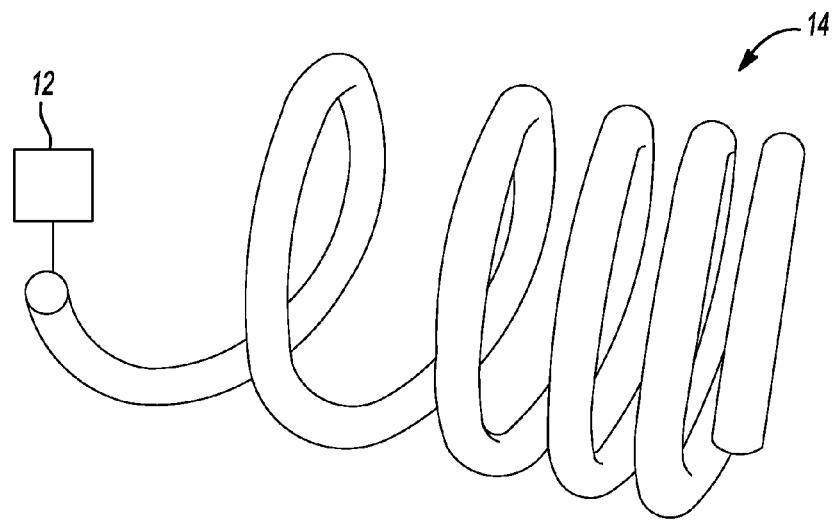
FIG. 7 is a perspective view of a waveguide according to the principles of the present teachings having a varying pitch.

To address this issue and to uniformly generate the white light throughout the entire device 10, in some embodiments of the present teachings the structure of the waveguide 14 is such that additional radiation loss is purposefully introduced via the intentional bending of the waveguide 14 as illustrated in FIGS. 6 and 7. The bending of the waveguide 14 enable some of the light ray guided by the waveguide 14 to leak out because the total internal reflection condition is no longer satisfied. By properly controlling the layout of the waveguide 14, the bending loss can increase along the waveguide length to compensate for the exponential decay of power (i.e. light intensity). Because the bending loss only depends on the bending radius for a particular waveguide structure, the radius of waveguide 14 can be varied continuously as illustrated in FIGS. 6 and 7 to achieve uniform white light output. In some embodiments, as illustrated in FIG. 6, waveguide 14 is structured as an upwardly extending, progressively tightening coil in which the internal bending radius is progressively increasing to offset the loss of light intensity. In this embodiment, the shape thereof is conducive to replacing existing lighting fixtures for incandescent light. In some embodiments, as illustrated in FIG. 7, waveguide 14 is structured as a helix having a generally constant outside diameter, but an increasing pitch in which the internal bending radius is again progressively increasing to offset the loss of light intensity. In this embodiment, the cylindrical shape thereof is conducive to replacing existing lighting fixtures for fluorescent light and can be done by wrapping the waveguide on a cylindrical mold. In some embodiments, the wrapping of the waveguide can be performed on a mold on which a reflection layer (e.g. metal) can be coated to increase the out-coupling efficiency.

Figure 4:
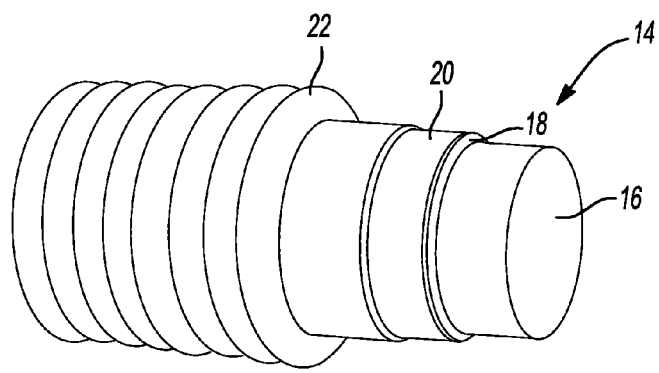
FIG. 4 is a bottom perspective view of a cylindrical waveguide assembly according to the principles of the present teachings.
Figure 5:
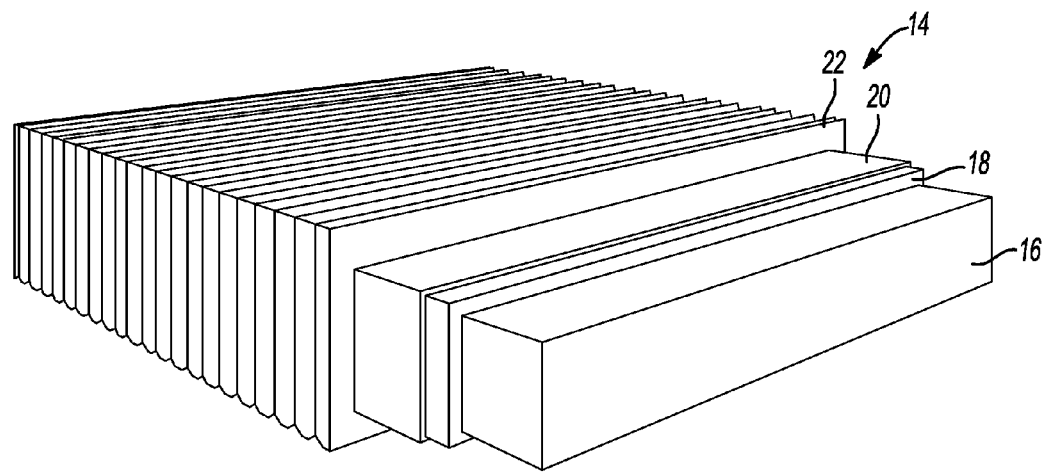
FIG. 5 is a bottom perspective view of a panel-shaped waveguide assembly according to the principles of the present teachings.
Figure 8A:
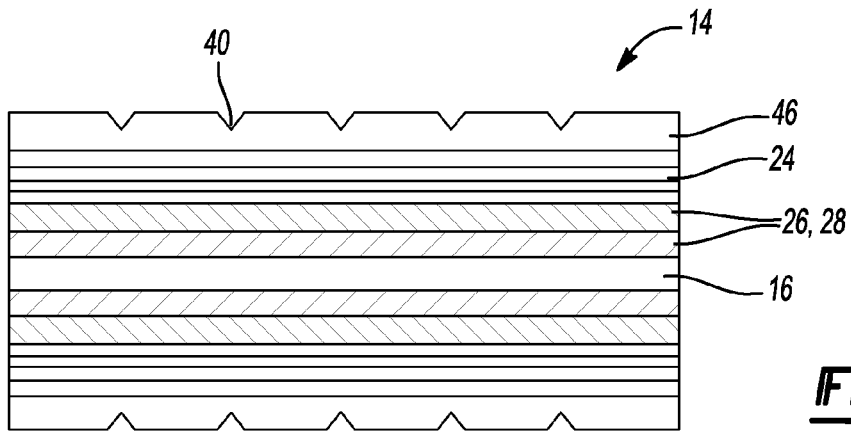
FIGS. 8a-8c are schematic cross-sectional views of a waveguide according to the principles of the present teachings having various surface treatments to promote light out coupling.
Figure 8B:
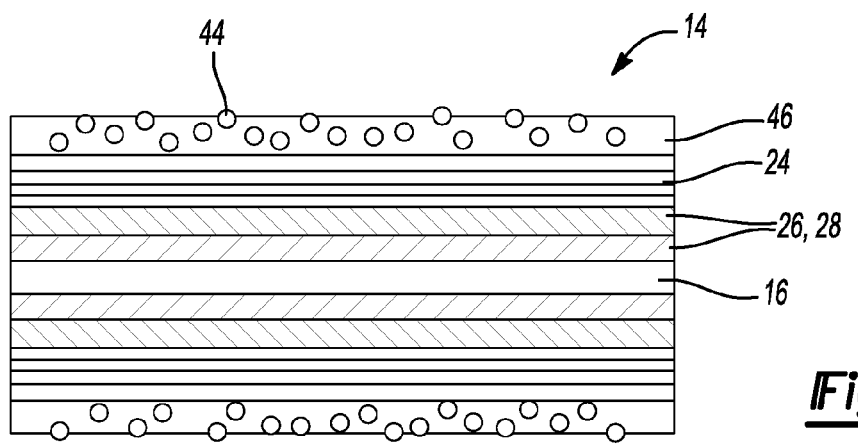
Figure 8C:
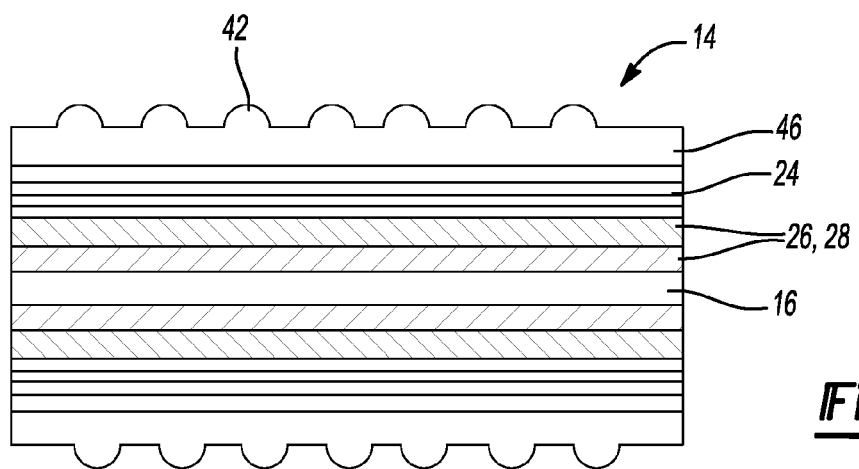

It should be recognized that waveguide 14 can define any one of a number of shapes, such as a cylindrical corrugated shape as illustrated in FIGS. 2 and 4, a corrugated panel shape as illustrated in FIG. 5, or varying pitch and/or radius circular shapes as partially illustrated in FIGS. 6 and 7. It should also be recognized, as illustrated in FIG. 8a-8c, that various surface treatments and texturing can be used along an outer boundary of waveguide assembly 14 for aesthetic and/or out coupling performance. For example, as illustrated in FIG. 8a, waveguide assembly 14 can comprise a plurality of inwardly directed cutouts, depressions, voids, or other inwardly-directed features 40 disposed in barrier 24 or an outer scatterer layer 46 to provide increased surface area and improved out coupling. Similarly, as illustrated in FIG. 8c, waveguide assembly 14 can comprise a plurality of outwardly directed extensions, features, or protuberances 42 disposed in barrier 24 or outer scatterer layer 46 to provide increased surface area and improved out coupling. Still further, as illustrated in FIG. 8b, waveguide assembly 14 can comprise a plurality of features 44, such as particles, embedded in barrier 24 or scatterer layer 46 to provide increased light dispersion and improved out coupling. In this way, the present teachings can be used for direct replacement for conventional incandescent, fluorescent, and other lighting systems and their associated form factor (e.g. elongated, panel, bulb, etc.).

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A solid state light source comprising;
    a light pump outputting light energy;
    a waveguide assembly optically coupled to said light pump for receiving said light energy, said waveguide assembly having at least a core section, said wave aide assembly being elongated having a cork-screw shape extending in three-dimensions and having a decreasing bending radius; and
    a down-converter being made of organic photo luminescent compounds doped into an inert matrix, said down-converter converting said light energy from said waveguide assembly to a lesser light energy and outputting said lesser light energy, said down-converter coaxially extending about at least a portion of said core section of said waveguide assembly to receive said light energy and output said lesser light energy therethrough,
    wherein said cork-screw shape extending in three-dimensions and having said decreasing bending radius is selected to produce a generally uniform level of said lesser light energy along a length of said down-converter.

2. The solid state light source according to claim 1 wherein said decreasing bending radius is selected to permit generally uniform, outwardly-directed light output along the length of said waveguide assembly to offset light energy loss along said waveguide assembly.

3. The solid state light source according to claim 1 wherein said decreasing bending radius is selected to permit a predetermined, non-constant light output rate along the length of said waveguide assembly.

4. The solid state light source according to claim 1 wherein said light pump is an LED.

5. The solid state light source according to claim 4 wherein said light pump is a blue LED.

6. The solid state light source according to claim 1 wherein said light pump is a laser.

7. The solid state light source according to claim 1 wherein said light pump outputs said light energy at a blue wavelength having a blue photon, and said down-converter comprises a first dye layer receiving said blue photon and outputting a first down-converted photon, said first down-converted photon having lesser energy than said blue photon with a longer wavelength of emitted light.

8. The solid state light source according to claim 7 wherein said down-converter comprises a second dye layer receiving said first down-converted photon and outputting a second down-converted photon, said second down-converted photon having lesser energy than said first down-converted photon and a correspondingly longer wavelength.

9. The solid state light source according to claim 1, further comprising:
a second light pump outputting light energy;
a second waveguide assembly optically coupled to said second light pump for receiving said light energy from said second light pump: and
a second organic-based down-converter for converting said light energy from said second waveguide assembly to a lesser light energy, said second organic-based down-converter having at least one of a molecular dye and a polymer.

10. The solid state light source according to claim 1 wherein said waveguide assembly comprises an exterior surface contoured to promote out coupling having a plurality of embedded features dispersing said lesser light energy, said exterior surface having a different refractive index than a refractive index of the material of said waveguide.

11. The solid state light source according to claim 1 wherein said waveguide assembly comprises an exterior surface having a plurality of inwardly-directed depressions to promote out coupling of said lesser light energy.

12. The solid state light source according to claim 1 wherein said waveguide assembly comprises an exterior surface having a plurality of outwardly-directed features to promote out coupling of said lesser light energy.

13. A solid state light source comprising:
a light pump outputting light energy;
a waveguide assembly optically coupled to said light pump for receiving said light energy, said waveguide assembly having at least a core section, said waveguide assembly is a helix shape having an increasing pitch measured along a longitudinal axis of said helix shape; and
a down-converter being made of organic photo luminescent compounds doped into an inert matrix, said down-converter converting said light energy from said waveguide assembly to a lesser light energy and outputting said lesser light energy, said down-converter coaxially extending about at least a portion of said core section of said waveguide assembly to receive said light energy and output said lesser light energy therethrough
wherein said helix shape having said increasing pitch is selected to produce a generally uniform level of said lesser light enemy along a length of said down-converter.

14. A method of outputting light energy comprising:
introducing light energy into a waveguide assembly, an intensity of said light energy within said waveguide assembly decreasing along a length of said waveguide assembly; and
longitudinally shaping said waveguide assembly to produce a generally uniform light leakage exiting a side of said waveguide assembly at a first longitudinal position of said waveguide assembly and at a second longitudinal position of said waveguide assembly downstream of said first longitudinal position, said light energy within said waveguide assembly being different at said first longitudinal position and said second longitudinal position.

15. A method of outputting light energy comprising:
introducing light energy into a waveguide assembly, an intensity of said light energy within said waveguide assembly decreasing along a length of said waveguide assembly; and
bending said waveguide assembly to form a progressively changing radius to produce a generally uniform light leakage exiting a side of said waveguide assembly at a first longitudinal position of said waveguide assembly, and at a second longitudinal position of said waveguide assembly downstream of said first longitudinal position, said light energy within said waveguide assembly being different at said first longitudinal position and said second longitudinal position.

\* \* \* \* \*